(12) United States Patent
Cerafogli et al.

(10) Patent No.: US 8,953,379 B2
(45) Date of Patent: *Feb. 10, 2015

(54) APPARATUSES AND METHODS OF REPROGRAMMING MEMORY CELLS

(71) Applicant: Micron Technology, Inc., Boise, ID (US)

(72) Inventors: Chiara Cerafogli, Avezzano (IT); Agostino Macerola, San Benedetto dei Marsi (IT)

(73) Assignee: Micron Technology, Inc., Boise, ID (US)

( * ) Notice: Subject to any disclaimer, the term of this patent is extended or adjusted under 35 U.S.C. 154(b) by 8 days.

This patent is subject to a terminal disclaimer.

(21) Appl. No.: 14/070,911

(22) Filed: Nov. 4, 2013

(65) Prior Publication Data

US 2014/0126295 A1 May 8, 2014

Related U.S. Application Data

(63) Continuation of application No. 13/218,665, filed on Aug. 26, 2011, now Pat. No. 8,593,873.

(51) Int. Cl.
*G11C 11/34* (2006.01)
*G11C 16/04* (2006.01)
*G11C 16/34* (2006.01)
*G11C 11/56* (2006.01)
*G11C 16/10* (2006.01)

(52) U.S. Cl.
CPC ........ *G11C 16/3459* (2013.01); *G11C 11/5628* (2013.01); *G11C 16/0483* (2013.01); *G11C 16/349* (2013.01); *G11C 16/10* (2013.01)
USPC ............. 365/185.18; 365/185.22; 365/185.11

(58) Field of Classification Search
USPC .............. 365/185.18, 185.22, 185.11, 185.33
See application file for complete search history.

(56) References Cited

U.S. PATENT DOCUMENTS

| 5,646,890 A | 7/1997 | Lee et al. |
| 6,128,224 A | 10/2000 | Morton et al. |
| 7,535,766 B2 | 5/2009 | Ito |
| 7,804,718 B2 | 9/2010 | Kim |
| 8,593,873 B2 * | 11/2013 | Cerafogli et al. ........ 365/185.18 |
| 2006/0256623 A1 | 11/2006 | Roohparvar |

* cited by examiner

*Primary Examiner* — Toan Le
(74) *Attorney, Agent, or Firm* — Brooks, Cameron & Huebsch, PLLC

(57) ABSTRACT

Apparatuses and methods for reprogramming memory cells are described. One or more methods for memory cell operation includes programming a number of memory cells such that each of the number of memory cells are at either a first program state or a second program state, the second program state having a first program verify voltage associated therewith; and reprogramming the number of memory cells such that at least one of the number of memory cells is reprogrammed to a third program state having a second program verify voltage associated therewith, wherein those of the number of memory cells having a threshold voltage less than the second program verify voltage represent a same data value.

20 Claims, 3 Drawing Sheets

APPARATUSES AND METHODS OF REPROGRAMMING MEMORY CELLS

PRIORITY INFORMATION

This application is a continuation of U.S. application Ser. No. 13/218,665, filed Aug. 26, 2011, which is incorporated by reference.

TECHNICAL FIELD

The present disclosure relates generally to semiconductor memory devices and methods, and more particularly, to methods and devices for memory cell operation.

BACKGROUND

Memory devices are typically provided as internal, semiconductor, integrated circuits and/or external removable devices in computers or other electronic devices. There are many different types of memory including random-access memory (RAM), read only memory (ROM), dynamic random access memory (DRAM), synchronous dynamic random access memory (SDRAM), phase change random access memory (PCRAM), and flash memory, among others.

Flash memory devices can be utilized as non-volatile memory for a wide range of electronic applications. Flash memory devices typically use a one-transistor memory cell that allows for high memory densities, high reliability, and low power consumption. Uses for flash memory include memory for solid state drives (SSDs), personal computers, personal digital assistants (PDAs), digital cameras, cellular telephones, portable music players, e.g., MP3 players, and movie players, among other electronic devices.

Two common types of flash memory array architectures are the "NAND" and "NOR" architectures, so called for the logical form in which the basic memory cell configuration of each is arranged. A NAND array architecture arranges its array of memory cells in a matrix such that the control gates of each memory cell in a "row" of the array are coupled to (and in some cases form) an access line, which is commonly referred to in the art as a "word line". However each memory cell is not directly coupled to a data line (which is commonly referred to as a bit line, in the art) by its drain. Instead, the memory cells of the array are coupled together in series, source to drain, between a common source and a data line, where the memory cells commonly coupled to a particular data line are referred to as a "column".

Memory cells in a NAND array architecture can be programmed to a targeted, e.g., desired, program state. For example, electric charge can be placed on or removed from a charge storage structure, e.g., a floating gate or charge trap, of a memory cell to put the cell into one of a number of program states. For example, a single level cell (SLC) can be programmed to one of two program states, such as to represent a binary data value, e.g., "1" or "0", stored by the cell. In a NAND architecture, a memory cell is erased prior to being programmed, and the cell is not reprogrammed prior to being erased. The memory cells of a NAND array are erased together in groups referred to as "blocks". Each block can include a number of pages of memory cells that are programmed and/or read together as a group. As such, pages of memory cells of a particular block are not reprogrammed individually without first erasing the entire block. Requiring a block to be erased before cells of the block can be reprogrammed can increase the wear of a memory device, among other drawbacks.

DETAILED DESCRIPTION

Figure 1:
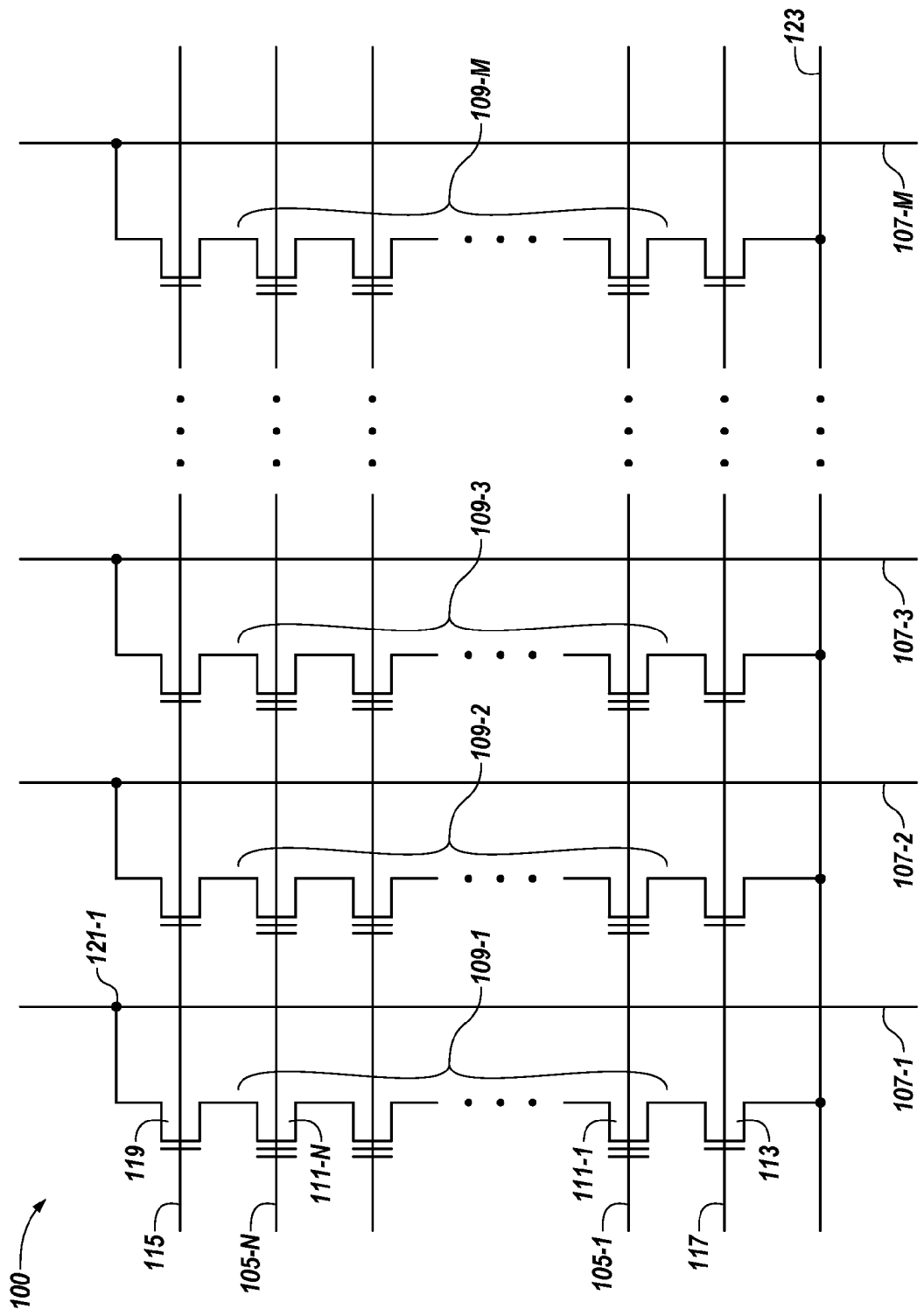
FIG. 1 is a schematic of a portion of an apparatus in the form of a non-volatile memory array in accordance with one or more embodiments of the present disclosure.

The present disclosure includes apparatuses and methods of reprogramming memory cells. One or more methods for memory cell operation includes programming a number of memory cells such that each of the number of memory cells are at either a first program state or a second program state, the second program state having a first program verify voltage associated therewith; and reprogramming the number of memory cells such that at least one of the number of memory cells is reprogrammed to a third program state having a second program verify voltage associated therewith, wherein those of the number of memory cells having a threshold voltage less than the second program verify voltage represent a same data value.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

As used herein, the designators "N," "M," and "R", particularly with respect to reference numerals in the drawings, indicates that a number of the particular feature so designated can be included with one or more embodiments of the present disclosure. Additionally, as used herein, "a number of" something can refer to one or more such things. For example, a number of memory devices can refer to one or more memory devices.

The figures herein follow a numbering convention in which the first digit or digits correspond to the drawing figure number and the remaining digits identify an element or component in the drawing. Similar elements or components between different figures may be identified by the use of similar digits. For example, 110 may reference element "10" in FIG. 1, and a similar element may be referenced as 210 in FIG. 2. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present invention, and should not be taken in a limiting sense.

FIG. 1 is a schematic of a portion of an apparatus in the form of a non-volatile memory array 100 in accordance with one or more embodiments of the present disclosure. The embodiment of FIG. 1 illustrates a NAND architecture non-volatile memory array. However, embodiments described herein are not limited to this example. As shown in FIG. 1, the memory array 100 includes access lines, e.g., word lines 105-1, . . . , 105-N and intersecting data lines, e.g., local bit lines 107-1, 107-2, 107-3, . . . , 107-M. For ease of addressing in the digital environment, the number of word lines 105-1, . . . , 105-N and the number of local bit lines 107-1, 107-2, 107-3, . . . , 107-M can be some power of two, e.g., 256 word lines by 4,096 bit lines.

Memory array 100 includes NAND strings 109-1, 109-2, 109-3, . . . , 109-M. Each NAND string includes non-volatile memory cells 111-1, . . . , 111-N, each communicatively coupled to a respective word line 105-1, . . . , 105-N. Each NAND string (and its constituent memory cells) is also associated with a local bit line 107-1, 107-2, 107-3, . . . , 107-M. The memory cells 111-1, . . . 111-N of each NAND string 109-1, 109-2, 109-3, . . . , 109-M are connected in series source to drain between a source select gate (SGS), e.g., a field-effect transistor (FET) 113, and a drain select gate (SGD), e.g., FET 119. Each source select gate 113 is configured to selectively couple a respective NAND string to a common source 123 responsive to a signal on source select line 117, while each drain select gate 119 is configured to selectively couple a respective NAND string to a respective bit line responsive to a signal on drain select line 115.

As shown in the embodiment illustrated in FIG. 1, a source of source select gate 113 is connected to a common source line 123. The drain of source select gate 113 is connected to the source of the memory cell 111-1 of the corresponding NAND string 109-1. The drain of drain select gate 119 is connected to bit line 107-1 of the corresponding NAND string 109-1 at drain contact 121-1. The source of drain select gate 119 is connected to the drain of the last memory cell 111-N, e.g., a floating-gate transistor, of the corresponding NAND string 109-1.

In one or more embodiments, construction of the non-volatile memory cells 111-1, . . . , 111-N includes a source, a drain, a floating gate or other charge storage structure, and a control gate. The memory cells 111-1, . . . , 111-N have their control gates coupled to a word line, 105-1, . . . , 105-N respectively. A NOR array architecture would be similarly laid out, except that the string of memory cells would be coupled in parallel between the select gates.

As one of ordinary skill in the art will appreciate, subsets of cells coupled to a selected word line, e.g., 105-1, . . . , 105-N, can be programmed and/or sensed, e.g., read, together as a group. A number of cells programmed and/or sensed together can correspond to a page of data. In association with a sensing operation, a number of cells coupled to a particular word line and programmed together to respective program states can be referred to as a target page. A programming operation, e.g., a write operation, can include applying a number of program pulses, e.g., 16V-20V, to a selected word line in order to increase the threshold voltage (Vt) of selected cells coupled to that selected access line to a desired program voltage level corresponding to a targeted program state.

A sensing operation, such as a read or program verify operation, can include sensing a voltage and/or current change of a bit line coupled to a selected cell in order to determine the program state of the selected cell. The sensing operation can include precharging a bit line and sensing the discharge when a selected cell begins to conduct.

Sensing the program state of a selected cell can include providing a number of sensing voltages, e.g., read voltages, to a selected word line while providing a number of voltages, e.g., read pass voltages, to the word lines coupled to the unselected cells of the string sufficient to place the unselected cells in a conducting state independent of the threshold voltage of the unselected cells. The bit line corresponding to the selected cell being read and/or verified can be sensed to determine whether or not the selected cell conducts in response to the particular sensing voltage applied to the selected word line. For example, the program state of a selected cell can be determined by the word line voltage at which the bit line current reaches a particular reference current associated with a particular state.

As one of ordinary skill in the art will appreciate, in a sensing operation performed on a selected memory cell in a NAND string, the unselected memory cells of the string are biased so as to be in a conducting state. In such a sensing operation, the program state of the selected cell can be determined based on the current and/or voltage sensed on the bit line corresponding to the string. For instance, the program state of the selected cell can be determined based on whether the bit line current changes by a particular amount or reaches a particular level in a given time period.

As an example, the memory cells of an array such as array 100 can be single level cells (SLCs). SLCs can be single-bit, e.g., two-state, memory cells. That is, the cells can be programmed to one of two program states, e.g., L0 and L1, respectively. In operation, a number of memory cells, such as in a selected block, can be programmed such that they have a Vt level corresponding to either L0 or L1. As an example, program state L0 can represent a stored data value such as binary "1". Program state L1 can represent a stored data value such as binary "0". However, embodiments are not limited to these data assignments, e.g., program state L0 can represent binary "0" and program state L1 can represent binary "1".

As further described below, in one or more embodiments, groups of memory cells, such as a number of memory cells on a wordline or in a block, for example, can be reprogrammed without being erased. For example, the memory cells can be reprogrammed, without erasing the memory cells prior to reprogramming, so that a portion of the memory cells are reprogrammed to a new program state representing a data value, such as binary "0", and the remaining memory cells remain in their originally programmed program states, where those original program states represent another data value, such as binary "1". At least a portion of the memory cells that are not reprogrammed to the new program state may have stored the data value represented by the new program state after reprogramming, e.g., binary "0", prior to the reprogramming operation. According to such an example, after the reprogramming operation, the memory cells that previously stored a binary "1" or "0" and have not had their threshold voltage increased to the new program state now store, for example, a binary "1", and memory cells that have their threshold voltage increased to the new program state now store, for example, a binary "0".

Figure 2A:
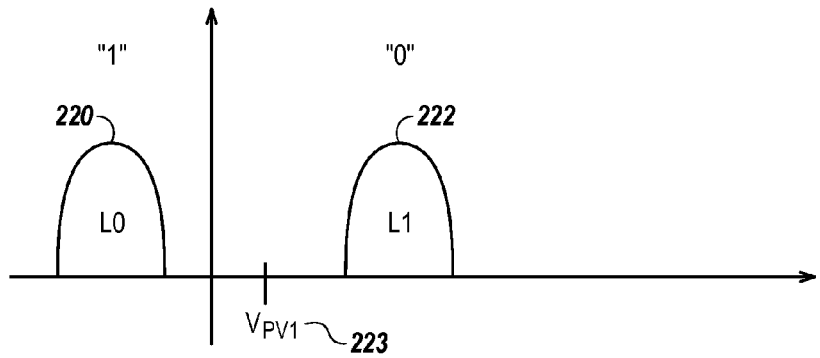
FIGS. 2A-2C are diagrams illustrating a number of threshold voltage distributions corresponding to program states associated with memory cells programmed and/or reprogrammed in accordance with one or more embodiments of the present disclosure.
Figure 2B:
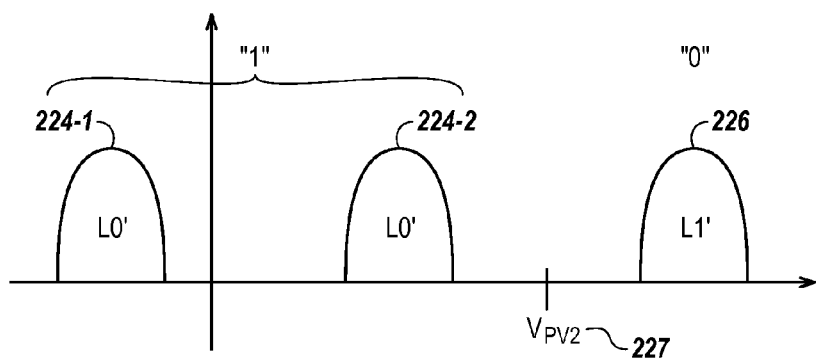
Figure 2C:
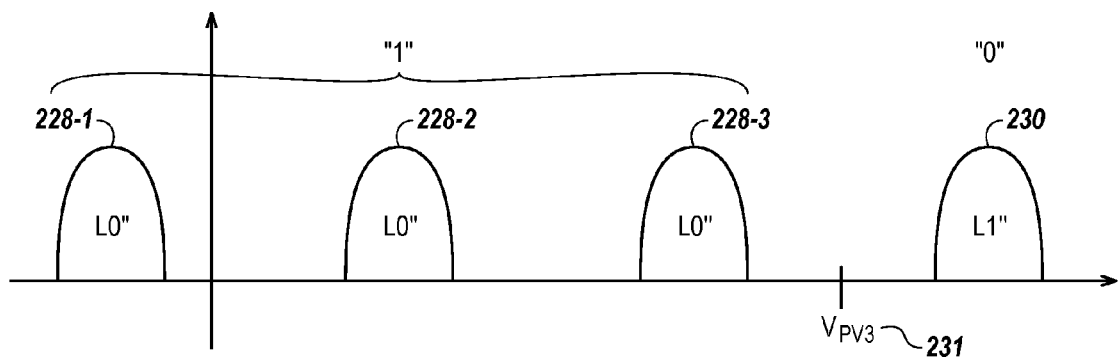

FIGS. 2A-2C are diagrams illustrating a number of threshold voltage distributions corresponding to program states associated with memory cells programmed and/or reprogrammed in accordance with one or more embodiments of the present disclosure. The memory cells associated with FIGS. 2A-2C can be memory cells such as cells 111-1, . . . , 111-N described in connection with FIG. 1. The memory cells associated with FIGS. 2A-2C are one-bit, e.g., two-state, SLCs. However, embodiments of the present disclosure are not limited to this example.

The Vt distributions 220 and 222 of FIG. 2A correspond to a number of memory cells programmed to one of two program states, e.g., L0 or L1. The Vt distributions 224-1, 224-2, and 226 of FIG. 2B correspond to the number of memory cells associated with FIG. 2A after to a reprogramming operation in which the cells are reprogrammed from states L0 and L1 to one of program states L0' and L1'. The Vt distributions 228-1, 228-2, 228-3, and 230 of FIG. 2C correspond to the number of memory cells associated with FIGS. 2A and 2B after a subsequent reprogramming operation in which the cells are reprogrammed from states L0' and L1' to one of program states L0" and L1".

In FIG. 2A, threshold voltage distribution 220 corresponds to a number of memory cells that are programmed to a first program state, e.g., L0. In at least some embodiments, programming a memory cells to the first program state may simply include allowing a memory cell to remain in an erased state. In other words, the first program state may actually be the erased state. Threshold voltage distribution 222 corresponds to a number of memory cells that are programmed from an erased state, which could be the same as the first program state, to a second program state, e.g., L1. A first program verify voltage 223 ($V_{PV1}$) is used when programming the number of memory cells to verify that the memory cells to be programmed to state L1 have a threshold voltage higher than $V_{PV1}$ 223. Threshold voltage distributions 220 and 222 can correspond to a group of cells, e.g., a page or a block, programmed as part of a first program operation. In this example, the memory cells programmed to the program state L0 represent, e.g., store, a first data value, e.g., binary "1". The memory cells programmed to the program state L1 represent a second data value, e.g., binary "0".

The threshold voltage distributions 224-1, 224-2, and 226 shown in FIG. 2B correspond to the number of memory cells associated with FIG. 2A after a reprogramming operation, which in some example, may be, but is not required to be, a first of more than one reprogramming operations. The reprogramming operation includes programming the memory cells previously programmed to one of program states L0 or L1 to one of program states L0' or L1'. For instance, Vt distribution 226 corresponds to those cells previously programmed to program state L0 or L1 and which are subsequently reprogrammed to the L1' program state. Vt distributions 224-1 and 224-2 correspond to those cells previously programmed to program state L0 or program state L1 and which are not programmed to program state L1' during the reprogramming operation. After the reprogramming operation, original program states L0 and L1 may be collectively considered program state L0'. A second program verify voltage 227 ($V_{PV2}$) is used when reprogramming the number of memory cells to verify that the memory cells to be programmed to the program state L1' have a threshold voltage higher than $V_{PV2}$ 227. The reprogramming operation associated with FIG. 2B includes reprogramming the number of memory cells associated with FIG. 2A without erasing the number of memory cells. After the reprogramming operation associated with FIG. 2B, those memory cells corresponding to Vt distributions 224-1 and 224-2 represent a same data value, e.g. binary "1" and those memory cells corresponding to Vt distribution 226 represent binary "0". As such, one or more memory cells within distribution 224-2, which stored a binary "0" prior to reprogramming, e.g., cells previously programmed to state L1, store binary "1" subsequent to reprogramming.

The threshold voltage distributions 228-1, 228-2, 228-3, and 230 shown in FIG. 2C correspond to the number of memory cells associated with FIGS. 2A and 2B after a second reprogramming operation, however a second reprogramming operation need not be part of all embodiments of the present disclosure. In other words, some embodiments may only incorporate a single reprogramming operation. The reprogramming operation associated with FIG. 2C includes programming the memory cells previously programmed to one of program states L0' or L1' to one of program states L0" or L1". For instance, Vt distribution 230 corresponds to those cells previously programmed to program state L0' or L1' and which are subsequently reprogrammed to the L1" program state. Vt distributions 228-1, 228-2, and 228-3 correspond to those cells previously programmed to program state L0' or program state L1' and which are not reprogrammed to program state L1" during the second reprogramming operation. A third program verify voltage 231 ($V_{PV3}$) is used when reprogramming the number of memory cells to verify that the memory cells to be programmed to the program state L1" have a threshold voltage higher than $V_{PV3}$ 231. The reprogramming operation associated with FIG. 2C includes reprogramming the number of memory cells associated with FIGS. 2A and 2B without erasing the number of memory cells. After the reprogramming operation associated with FIG. 2C, those memory cells corresponding to Vt distributions 228-1, 228-2, and 228-3 represent a same data value, e.g. binary "1" and those memory cells corresponding to Vt distribution 230 represent a different data value, e.g., a binary "0". As such, one or more memory cells within distribution 228-3 which stored a binary "0" prior to the second reprogramming operation, e.g., cells previously programmed to state L1 store a binary "1" subsequent to the second reprogramming operation.

In one or more embodiments, the number of memory cells can be reprogrammed a number of times. The number of times the number of memory cells can be reprogrammed can be limited by the available programming window, e.g., voltage range. Each time a memory cell and/or a group of memory cells, such as a page, a block, and/or memory cells on a wordline, for example, are programmed and/or reprogrammed an indication, e.g., a flag, can be stored. The flag can indicate whether and/or how many times a particular memory cell and/or group of memory cells, e.g., page, have been reprogrammed. The indication can be stored in one or more memory cells and/or in a register, for example. In one or more embodiments, the flag can provide an indication on a wordline by wordline and/or a block by block basis that memory cells of a particular wordline and/or block have been programmed and/or reprogrammed.

Figure 3:
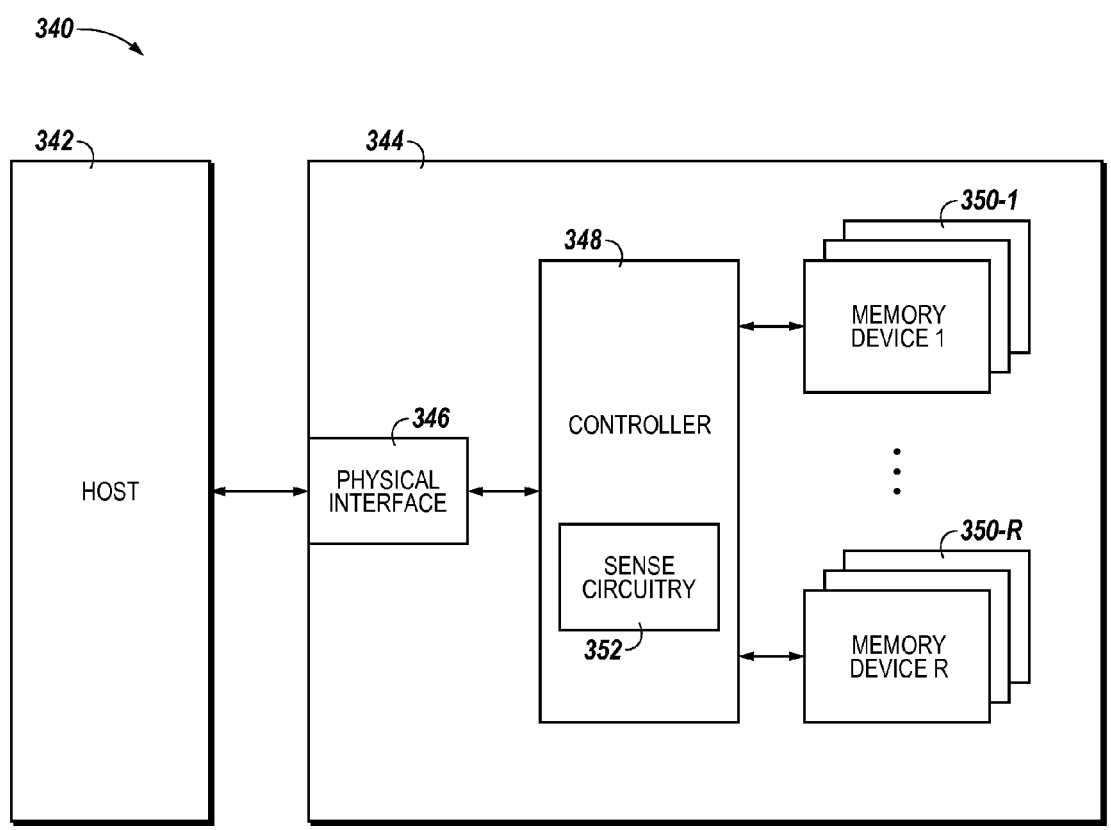
FIG. 3 is a functional block diagram of an apparatus in the form of a computing system including at least one memory system in accordance with one or more embodiments of the present disclosure.

FIG. 3 is a functional block diagram of an apparatus in the form of a computing system 340 including at least one memory system 344 in accordance with one or more embodiments of the present disclosure. Memory system 344 can be, for example, a solid state drive (SSD). In the embodiment illustrated in FIG. 1, memory system 344 includes a physical host interface 346, a number of memory devices 350-1, . . . , 350-R (e.g., solid state memory devices), and a controller 348 (e.g., an SSD controller) coupled to physical host interface 346 and memory devices 310-1, . . . , 310-N.

Physical host interface 346 can be used to communicate information between memory system 344 and another device such as a host 342. Host 342 can include a memory access device (e.g., a processor). One of ordinary skill in the art will appreciate that "a processor" can intend a number of processors, such as a parallel processing system, a number of coprocessors, etc. Example hosts can include laptop computers, personal computers, digital cameras, digital recording and playback devices, mobile telephones, PDAs, memory card readers, interface hubs, and the like.

Physical host interface 346 can be in the form of a standardized physical interface. For example, when memory system 344 is used for information storage in computing system 340, physical host interface 346 can be a serial advanced technology attachment (SATA) physical interface, a peripheral component interconnect express (PCIe) physical interface, or a universal serial bus (USB) physical interface, among other physical connectors and/or interfaces. In general, however, physical host interface 346 can provide an interface for passing control, address, information (e.g., data), and other signals between memory system 344 and a host (e.g., host 342) having compatible receptors for physical host interface 346.

Controller 348 can include, for example, control circuitry and/or firmware. Controller 348 can be included on the same physical device (e.g., the same die) as memory devices 350-1, . . . , 350-R. For example, controller 348 can be an application specific integrated circuit (ASIC) coupled to a printed circuit board including physical host interface 346 and memory devices 350-1, . . . , 350-R. Alternatively, controller 348 can be included on a separate physical device that is communicatively coupled to the physical device that includes memory devices 350-1, . . . , 350-R.

Controller 348 can communicate with memory devices 350-1, . . . , 350-R to sense (e.g., read), program (e.g., write), and/or erase information, among other operations. Controller 348 can have circuitry that may be a number of integrated circuits and/or discrete components. In a number of embodiments, the circuitry in controller 348 may include control circuitry for controlling access across memory devices 350-1, . . . , 350-R and/or circuitry for providing a translation layer between host 342 and memory system 344. The controller 348 includes sense circuitry 352 to determine the program state of memory cells, for instance.

Memory devices 350-1, . . . , 350-R can include, for example, a number of non-volatile memory arrays (e.g., arrays of non-volatile memory cells). For instance, memory devices 350-1, . . . , 350-R can include arrays of memory cells, such as array 100 described in FIG. 1, which can be operated in accordance with embodiments described herein. As will be appreciated by those of ordinary skill in the art, the memory cells in the memory arrays of memory devices 350-1, . . . , 350-R can be in a NAND architecture, a NOR architecture, or some other memory array architecture.

The memory arrays of memory devices 350-1, . . . , 350-R can include a number of memory cells that can be grouped. As used herein, a group can include a number of memory cells, such as a page, block, plane, die, an entire array, or other groups of memory cells. For example, some memory arrays can include a number of pages of memory cells that make up a block of memory cells. A number of blocks can be included in a plane of memory cells. A number of planes of memory cells can be included on a die. As an example, a 128 GB memory device can include 4320 bytes of information per page, 128 pages per block, 2048 blocks per plane, and 16 planes per device.

The embodiment illustrated in FIG. 3 can include additional circuitry that is not illustrated so as not to obscure embodiments of the present disclosure. For example, memory device 303 can include address circuitry to latch address signals provided over I/O connectors through I/O circuitry. Address signals can be received and decoded by a row decoder and a column decoder, to access memory array 300. It will be appreciated by those skilled in the art that the number of address input connectors can depend on the density and architecture of memory device 303 and/or memory array 300.

Conclusion

The present disclosure includes apparatuses and methods for reprogramming memory cells. One or more methods for memory cell operation includes programming a number of memory cells such that each of the number of memory cells are at either a first program state or a second program state, the second program state having a first program verify voltage associated therewith; and reprogramming the number of memory cells such that at least one of the number of memory cells is reprogrammed to a third program state having a second program verify voltage associated therewith, wherein those of the number of memory cells having a threshold voltage less than the second program verify voltage represent a same data value.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for operating memory cells, comprising:
reprogramming at least one of a number of memory cells that are at either a first program state or a second program state and are associated with a first program verify voltage to a third program state associated with a second program verify voltage, wherein those of the number of memory cells having a threshold voltage less than the second program verify voltage represent a same data value.

2. The method of claim 1, wherein reprogramming the number of memory cells includes reprogramming a number of single level cells (SLC) in a NAND array.

3. The method of claim 1, including providing an indication on an access line by access line basis that memory cells of a particular access line have been programmed.

4. The method of claim 1, including providing an indication on an access line by access line basis that memory cells of a particular access line have been reprogrammed.

5. The method of claim 1, wherein after reprogramming the at least one of the number of memory cells, the memory cells of the number of memory cells having a threshold voltage greater than the second program verify voltage represent a data value that is different than the data value represented by the memory cells of the number of memory cells having a threshold voltage less than the second program verify voltage.

6. The method of claim 1, wherein, prior to reprogramming the at least one of the number of memory cells from its respective program state to the third program state, those memory cells at the first program state represent a different data value than those memory cells at the second data state.

7. The method of claim 1, wherein, after reprogramming the at least one of the number of memory cells from its respective program state to the third program state, those memory cells at the first and second program states represent a same data value.

8. The method of claim 1, wherein, after reprogramming the at least one of the number of memory cells from its respective program state to the third program state, those memory cells at the third program state represent a data value that is different than a data value represented by memory cells at the first and second program states.

9. The method of claim 1, including reprogramming at least one of the number of memory cells from its respective program state to a fourth program state having a third program verify voltage associated therewith, wherein the third program verify voltage is greater than threshold voltages of memory cells at the first, second, and third program states.

10. The method of claim 9, wherein, prior to reprogramming the least one of the number of memory cells from its respective program state to the fourth program state, those memory cells at the third program state represent a different data value than those memory cells at the first and second program states.

11. The method of claim 9, wherein, after reprogramming the least one of the number of memory cells from its respective program state to the fourth program state, those memory cells at the first, second, and third program states represent a same data value.

12. An apparatus, comprising:
an array of memory cells; and
a controller operably coupled to the array and configured to:
program each memory cell of a group of memory cells to either a first program state or a second program state; and
reprogram at least one memory cell of a group of memory cells that are at either a first program state or a second program state to a third program state, wherein after reprogramming the first and second program states represent a same data value.

13. The apparatus of claim 12, wherein, prior to reprogramming, the first program state represents a first data value and the second program state represents a second data value; and wherein, after reprogramming, the third program state represents either the first data value or the second data value.

14. The apparatus of claim 12, wherein the controller is configured to reprogram the group of memory cells without first erasing the group of memory cells.

15. The apparatus of claim 12, wherein the controller is configured to reprogram the group of memory cells on an access line by access line basis.

16. The apparatus of claim 12, wherein the group of memory cells includes only single level cells.

17. An apparatus, comprising:
an array of memory cells; and
a controller operably coupled to the array and configured to:
adjust a program verify voltage from an initial voltage to an adjusted program verify voltage, wherein at least one memory cell from a group of memory cells is reprogrammed from a first program state or a second program state to a third program state associated with the adjusted program verify voltage.

18. The apparatus of claim 17, wherein the controller is configured to reprogram the memory cells of the group such that a number of memory cells of the group reprogrammed to the first or second program state are considered erased.

19. The apparatus of claim 18, wherein the controller is configured to provide an indication that the group has been reprogrammed.

20. The apparatus of claim 19, wherein the indication is a flag.

* * * * *

UNITED STATES PATENT AND TRADEMARK OFFICE
CERTIFICATE OF CORRECTION

PATENT NO. : 8,953,379 B2  
APPLICATION NO. : 14/070911  
DATED : February 10, 2015  
INVENTOR(S) : Chiara Cerafogli et al.

Page 1 of 1

It is certified that error appears in the above-identified patent and that said Letters Patent is hereby corrected as shown below:

In the claims,

In column 9, line 19, in Claim 10, before "least" insert -- at --.

In column 9, line 25, in Claim 11, before "least" insert -- at --.

Signed and Sealed this
Fifth Day of May, 2015

Michelle K. Lee
*Director of the United States Patent and Trademark Office*